United States Patent [19]

Ikeda et al.

[11] Patent Number: 5,433,780
[45] Date of Patent: Jul. 18, 1995

[54] VACUUM PROCESSING APPARATUS AND EXHAUST SYSTEM THAT PREVENTS PARTICLE CONTAMINATION

[75] Inventors: Towl Ikeda, Yamanashi; Teruo Iwata, Nirasaki, both of Japan

[73] Assignee: Tokyo Electron Limited, Tokyo, Japan

[21] Appl. No.: 154,563

[22] Filed: Nov. 19, 1993

[30] Foreign Application Priority Data

Nov. 20, 1992 [JP] Japan .................. 4-335186
Jan. 18, 1993 [JP] Japan .................. 5-023767

[51] Int. Cl.⁶ .................. C23C 16/00; C23C 14/00
[52] U.S. Cl. .................. 118/50; 118/715; 118/719; 204/298.33
[58] Field of Search ............ 118/715, 723 VE, 723 R, 118/50; 204/198.33, 298.33

[56] References Cited

U.S. PATENT DOCUMENTS

| | | | |
|---|---|---|---|
| 3,875,068 | 4/1975 | Mitzel | 250/531 |
| 4,269,137 | 5/1981 | Johnson | 118/50.1 |
| 5,024,182 | 6/1991 | Kobayashi | 118/723 |
| 5,054,420 | 10/1991 | Raghavan | 118/715 |
| 5,076,205 | 12/1991 | Vowles | 118/719 |
| 5,135,608 | 8/1992 | Okutani | 156/643 |
| 5,186,756 | 2/1993 | Benko | 118/730 |
| 5,227,340 | 7/1993 | Pintchouski | 437/225 |
| 5,250,092 | 10/1993 | Nakano | 96/136 |
| 5,304,248 | 4/1994 | Cheng | 118/728 |
| 5,316,579 | 5/1994 | McMillan | 118/50 |

*Primary Examiner*—R. Bruce Breneman
*Assistant Examiner*—Jeffrie R. Lund
*Attorney, Agent, or Firm*—Oblon, Spivak, McClelland, Maier & Neustadt

[57] ABSTRACT

A vacuum processing apparatus comprises a vacuum processing chamber for subjecting an object to be processed to a predetermined vacuum processing, an auxiliary vacuum chamber whose internal pressure is variable repeatedly between an atmospheric pressure and a process pressure, when the object is put in and taken out of the vacuum processing chamber, and exhaust system for exhausting a gas from the auxiliary vacuum chamber. The exhaust system has at least one exhaust port located apart from an internal wall surface of the auxiliary vacuum chamber.

13 Claims, 6 Drawing Sheets

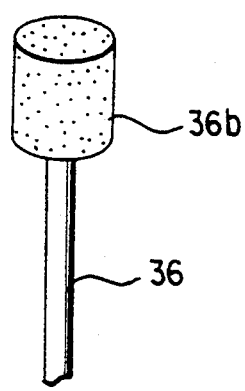
F I G. 5A
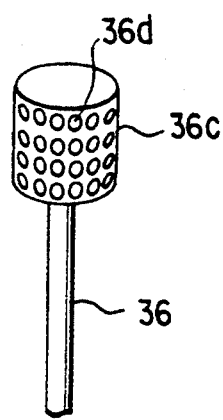
F I G. 5B
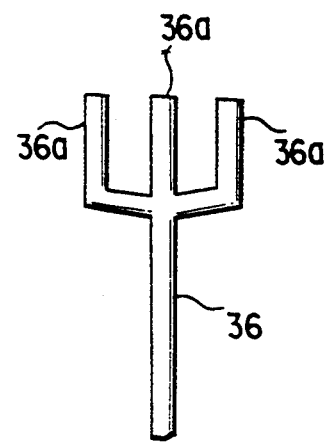
F I G. 5C
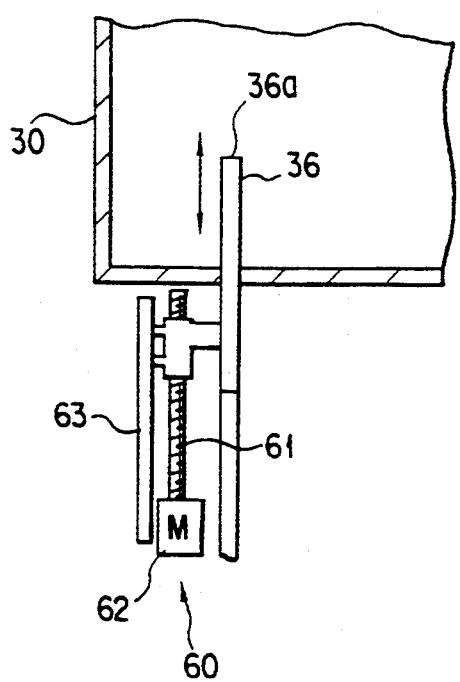
F I G. 6
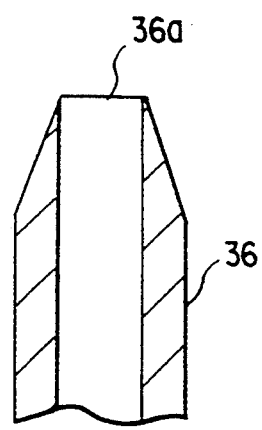
F I G. 7

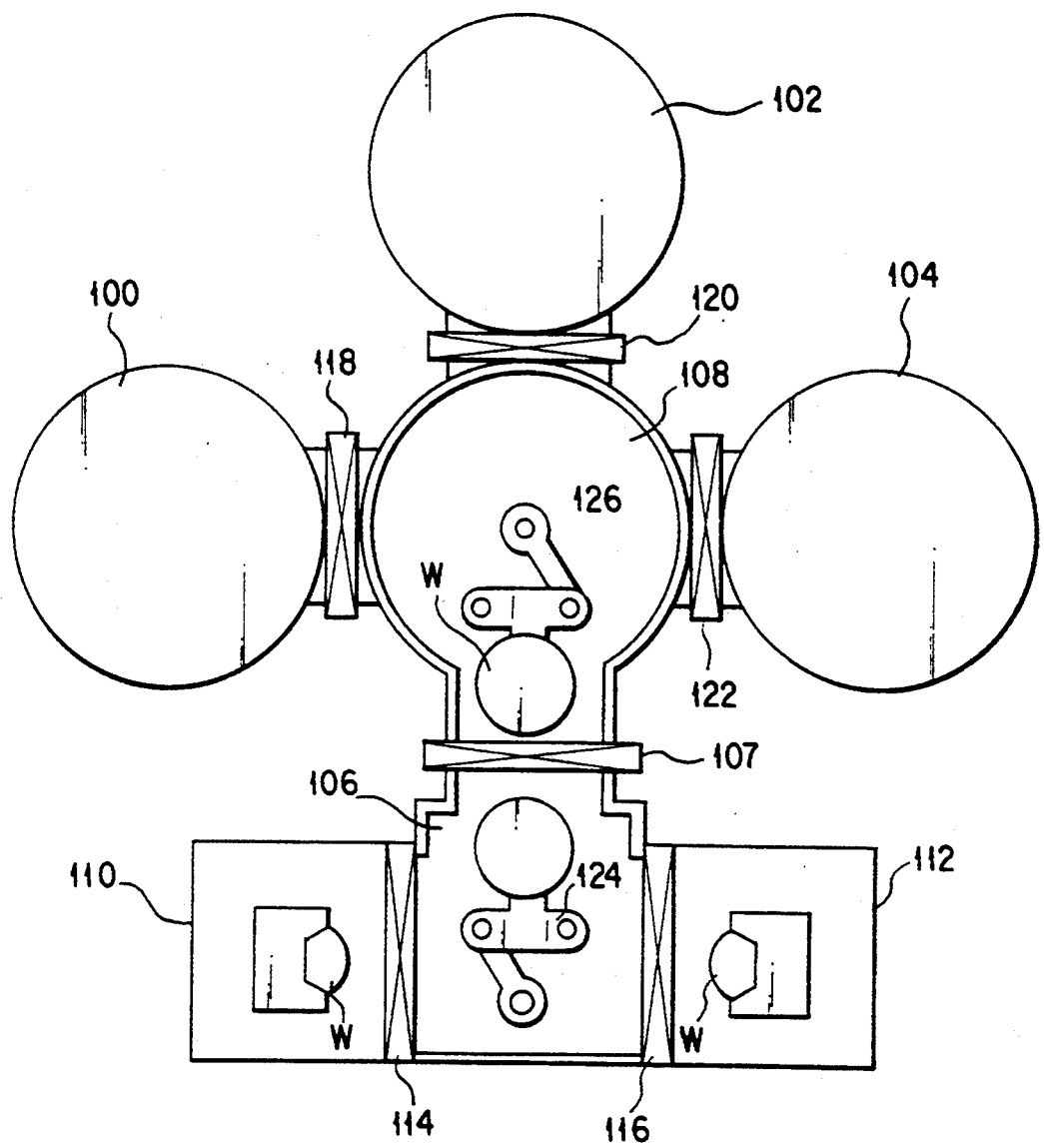
F I G. 13

VACUUM PROCESSING APPARATUS AND EXHAUST SYSTEM THAT PREVENTS PARTICLE CONTAMINATION

BACKGROUND OF THE INVENTION

1. Field of the Invention

The present invention relates to a vacuum processing apparatus for treating an object in a vacuum, such as an etching apparatus, an ashing apparatus, an ion inplantation apparatus, or a sputtering apparatus.

2. Description of the Related Art

In conventional vacuum processing apparatuses, in general, an object to be processed is contained in a vacuum processing chamber, and a vacuum is created within the chamber. A given vacuum process is applied to the object in the vacuum atmosphere. Such vacuum processing apparatuses include, for example, an etching apparatus, an ashing apparatus, an ion injection apparatus, a sputtering apparatus and a vacuum CVD apparatus. In this type of vacuum processing apparatus, once the pressure within the vacuum processing chamber is restored to a normal pressure, it is necessary to create a vacuum once again to a predetermined pressure level, which requires a very long time. Thus, in order to raise a through-put of vacuum process, an auxiliary vacuum chamber having a smaller volume than the vacuum processing chamber is provided adjacent to the vacuum processing chamber, and the pressure within the auxiliary vacuum chamber alone is restored to a normal pressure level or a vacuum is created within the auxiliary vacuum chamber alone.

In the auxiliary vacuum chamber, however, there are reaction products due to etching with the vacuum process within the vacuum processing chamber, a transfer mechanism for transferring wafers between the auxiliary vacuum chamber and the vacuum processing chamber, and many particles produced by a driving mechanism, etc. Particles which have fallen within the chamber are dispersed by gas flows caused when the auxiliary vacuum chamber is evacuated to create a vacuum or nitrogen gas is supplied in the auxiliary vacuum chamber to restore the internal pressure to a normal pressure level. The dispersed particles adhere to semiconductor wafers and degrade the quality of the wafers, resulting in a decrease in yield.

In the prior art, a turbulent flow within the chamber is suppressed by supplying nitrogen gas slowly into the auxiliary vacuum chamber at the time of supplying nitrogen gas or by evacuating the chamber slowly ("slow evacuation" or "slow ventilation"), thereby preventing dispersion of particles as much as possible.

In the case of the conventional vacuum processing apparatus, however, the pressure within the auxiliary vacuum chamber is frequently changed from a normal pressure level to a vacuum pressure level, or vice versa. By the slow evacuation, a turbulent flow near an exhaust port can be suppressed and dispersion of micron-order particles can be prevented. However, dispersion of sub-micron-order or half-micron-order particles of, e.g. 1.0 to 0.03 $\mu$m cannot be prevented by the slow evacuation or the like.

Accordingly, when a semiconductor device such as a 4MDRAM, which requires only micron-order fine processing, is manufactured, dispersion of particles can be sufficiently prevented by the slow evacuation of the conventional vacuum processing apparatus. In the case of manufacturing a semiconductor device of 16MRAM or a greater-capacity RAM, which requires submicron- or half-micron-order fine treatment, it is difficult to prevent dispersion of submicron- or half-micron-order particles with the conventional vacuum processing apparatus. Such submicron- or half-micron-order particles may adhere to the semiconductor wafer W, degrading the quality of the wafer and lowering the yield.

SUMMARY OF THE INVENTION

The present invention has been made under the above circumstances, and its object is to provide a vacuum processing apparatus which can prevent dispersion of very fine particles in the submicron or half-micron order of, e.g. about 0.03 to 1 $\mu$m, and can subject objects of 16MDRAM or a greater memory capacity, which require very fine processing in the submicron or half-micron order, to vacuum processing without degrading the quality of the objects or the yield of manufacture.

According to a first aspect of the present invention, there is provided a vacuum processing apparatus comprising: a vacuum processing chamber for subjecting an object to be processed to a predetermined vacuum process; a pressure variable chamber whose internal pressure is variable repeatedly between an atmospheric pressure and a process pressure, when the object is put in and taken out of the vacuum processing chamber; and exhaust means for exhausting gas from the pressure variable chamber, wherein the exhaust means has at least one exhaust port located apart from an internal wall surface of the pressure variable chamber.

According to a second aspect of the invention, there is provided a vacuum processing apparatus comprising: a vacuum processing chamber for subjecting an object to be processed to a predetermined vacuum processing; a pressure variable chamber whose internal pressure is variable repeatedly between an atmospheric pressure and a process pressure, when the object is put in and taken out of the vacuum processing chamber; and exhaust means for exhausting gas from the pressure variable chamber, wherein the exhaust means includes an exhaust port formed in a wall of the pressure variable chamber and an exhaust member situated to face the wall and having many fine pores, and a gas within the pressure variable chamber is exhausted from the exhaust port via the many fine pores of the exhaust member.

According to a third aspect of the invention, there is provided a vacuum processing apparatus comprising: a vacuum processing chamber for subjecting an object to be processed to a predetermined vacuum processing; a pressure variable chamber whose internal pressure is variable repeatedly between an atmospheric pressure and a process pressure, when the object is put in and taken out of the vacuum processing chamber; and exhaust means for exhausting a gas from the pressure variable chamber, wherein the exhaust means includes many needle-like exhaust pipes distal end portions of which project from a surface of a wall of the pressure variable chamber and have exhaust ports.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A, 5B and 5C show modifications of exhaust ports in the present invention;

FIG. 6 shows a mechanism for driving an exhaust pipe;

FIG. 7 shows another example of the exhaust pipe;

FIG. 13 shows a vacuum processing apparatus according to still another aspect of the invention.

DETAILED DESCRIPTION OF THE PREFERRED EMBODIMENT

The inventors have thoroughly studied the behaviors of particles, in particular, dispersion of particles, in a chamber for processing an object, where the internal pressure thereof varies abruptly and frequently, as in an auxiliary vacuum chamber in a vacuum processing apparatus. They have found that dispersion of particles occurs in a conventional vacuum processing apparatus since a vacuum exhaust port of the auxiliary vacuum chamber is located at an inner wall portion thereof.

Figure 1:
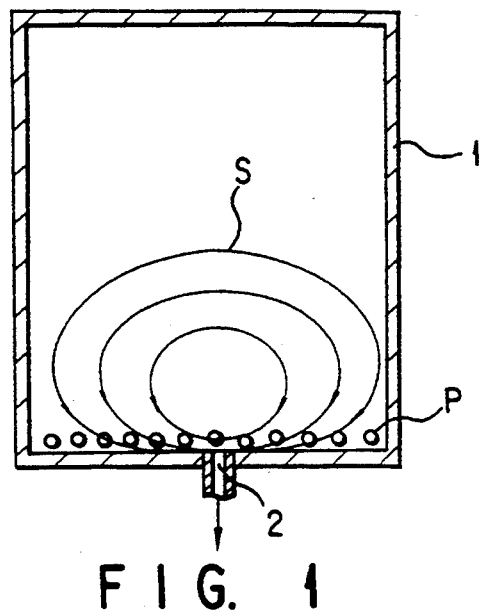
FIG. 1 shows schematically an exhaust flow in the case where an exhaust port is formed at a bottom wall.

Specifically, when the vacuum exhaust port is present at an inner wall portion of the auxiliary vacuum chamber, e.g. at a bottom surface portion thereof, a viscous flow acts on the inner wall of the auxiliary vacuum chamber at the beginning of evacuation of internal gas through the exhaust port, since the viscous flow of the gas is predominant at a normal pressure or thereabouts. According to the inventors' findings, as shown in FIG. 1, at the beginning of evacuation, a viscous flow S forms in the vicinity of an exhaust port 2 within an auxiliary vacuum chamber 1, and that even if gas in the chamber is evacuated by slow evacuation, submicron- or half-micron-order particles P of very small grain size, e.g. 1 to 0.03 μm, on the inner wall are dispersed by the viscous gas flow. As the slow evacuation progresses and the degree of vacuum increases, the gas changes gradually to a molecular flow. The fine particles dispersed at the beginning of evacuation fly freely within the chamber by kinetic energy acquired from the initial viscous flow S, and the particles adhere to a semiconductor wafer W, resulting in a decrease in quality of the wafer w and a decrease in yield.

The present invention has been made on the basis of the above findings, and it provides a vacuum processing chamber wherein an auxiliary vacuum chamber is provided adjacent to a vacuum processing chamber for subjecting an object to a predetermined vacuum process, the internal pressure of the auxiliary vacuum chamber being variable repeatedly when the object is put in or taken out of the vacuum processing chamber, and at least one exhaust port is provided on evacuation means for evacuating the auxiliary vacuum chamber at a position apart from the inner wall of the auxiliary vacuum chamber.

The present invention will now be described in detail.

Figure 2:
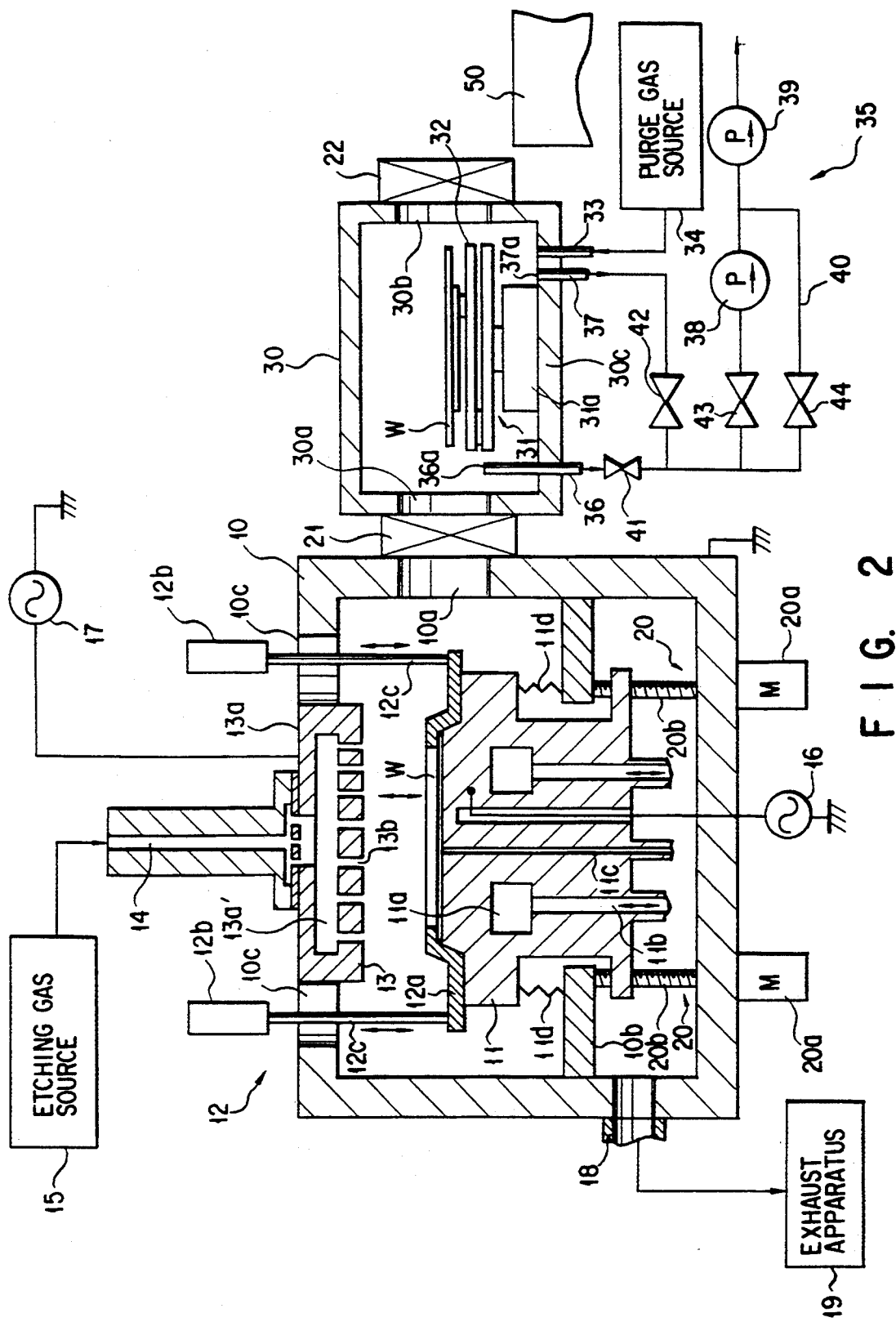
FIG. 2 is a cross-sectional view showing a plasma etching apparatus according to one aspect of the present invention.

FIG. 2 is a cross-sectional view showing a plasma etching apparatus according to one aspect of the present invention. As is shown in FIG. 2, the plasma etching apparatus comprises a vacuum processing chamber 10 for subjecting an object (e.g. semiconductor wafer) to an etching process, and an auxiliary vacuum chamber 30 coupled to the vacuum processing chamber 10 so that the auxiliary vacuum chamber 30 can communicate with the chamber 10.

The vacuum processing chamber 10 has an opening 10a at a portion communicating with the auxiliary vacuum chamber 30, and the auxiliary vacuum chamber 30 has an opening 30a at a portion communicating with the vacuum processing chamber 10. A gate valve 21 is connected between the vacuum processing chamber 10 and auxiliary vacuum chamber 30 to open/close the openings 10a and 30a. On the other hand, the auxiliary vacuum chamber 30 has another opening 30b at a portion on the side opposite to the vacuum processing chamber 10. The opening 30b is opened/closed by a gate valve 22. The gate valve 21 is opened when the semiconductor wafer W is transferred between the vacuum processing chamber 10 and auxiliary vacuum chamber 30. The gate valve 22 is opened when the semiconductor wafer W, after etching, is taken out of the auxiliary vacuum chamber 30, or when the semiconductor wafer W to be subjected to the etching treatment is put into the auxiliary vacuum chamber 30.

A lower electrode 11 serving as a table for the semiconductor wafer w is situated within the vacuum processing chamber 10. A circulation path 11a for circulating a refrigerant (e.g. helium gas) for cooling the lower electrode 11 is formed within the electrode 11. The lower electrode 11 is cooled while helium gas supplied via a cooling pipe 11b connected to the circulation path 11a is circulated through the circulation path 11a. In addition, a heat conductive gas passage 11c is formed within the lower electrode 11, and a heat-conductive gas is supplied through the gas passage 11c to a region between the wafer w and the lower electrode 11.

A clamp mechanism 12 for clamping the semiconductor wafer W onto the lower electrode 11 by pushing a peripheral portion of the wafer W is provided around the lower electrode 11. The clamp mechanism 12 comprises a clamp ring 12a, a pair of cylinder mechanisms 12b situated above the vacuum processing chamber 10, and rods 12c for connecting the ring 12a and the cylinder mechanisms 12b. The cylinder mechanisms 12b cause the clamp ring 12a to apply a pushing force onto the wafer W via the rods 12c.

A discoid upper electrode 13 having a hollow portion 13a' is situated above the lower electrode 11. A gas supply pipe 14 for supplying an etching gas is connected to an upper surface of the upper electrode 13. A great number of holes 13b are formed in a lower surface portion of the upper electrode 13. The etching gas is supplied from an etching gas supply source 15 into the upper electrode 14 via the gas supply, and the etching gas is further supplied into the vacuum processing chamber 10 through the holes 13b. An insulating member 10c is provided between the upper electrode 13 and an upper wall portion of the vacuum processing chamber 10.

High-frequency power supplies 16 and 17 are connected, respectively, to the lower electrode 11 and upper electrode 13, and high-frequency voltages are applied from the power supplies 16 and 17 to the lower and upper electrodes 11 and 13.

A vacuum exhaust pipe 18 is connected to a side portion of the vacuum processing chamber 10 near the lower end of the chamber 10. The vacuum processing chamber 10 is evacuated by a vacuum exhaust apparatus 19 via the vacuum exhaust pipe 18 to a predetermined degree of vacuum (e.g. $10^{-6}$ Torr).

The lower electrode 11 can be vertically moved by a pair of driving mechanisms 20. When the wafer is put into or taken out of the chamber 10, the lower electrode 11 is lowered. When treatment is performed, the electrode 11 is raised. Each driving mechanism 20 comprises a motor 20a and a ball screw 20b. The lower electrode 11 is vertically moved along guides (not shown) by rotating the ball screws 20b by means of the motors 20a. An annular projection 10b is formed on the side wall of the vacuum processing chamber 10 to extend inwards. A bellows 11d is provided between the projection 10b and the lower electrode 11, so that airtightness in the vacuum processing chamber 10 is maintained even if the lower electrode 11 is vertically moved.

A transfer robot 31 for transferring the semiconductor wafer W is situated within the auxiliary vacuum chamber 30. The robot 31 comprises a base table 31a and a multi-joint arm 32. The multi-joint arm 32 performs transfer of the semiconductor wafer W between the vacuum processing chamber 10 and an auto-loader 50 provided outside the auxiliary vacuum chamber 30. A gas supply pipe 33 for supplying a clean gas (e.g. nitrogen) as a purge gas is connected to a bottom surface of the auxiliary vacuum chamber 30. The purge gas is supplied from a purge gas supply source 34 into the auxiliary vacuum chamber 30 via the supply pipe 33. An exhaust system 35 for evacuating the auxiliary vacuum chamber 30 is also provided.

The exhaust system 35 comprises a first exhaust pipe 36 and a second exhaust pipe 37. The first exhaust pipe 36 projects from a bottom wall 30c of the auxiliary vacuum chamber 30 into a center region of the inside space of the chamber 30, such that an exhaust port 36a at the end of the first exhaust pipe 36 is situated at the center region of the chamber 30. The first exhaust pipe 36 sucks gas from the exhaust port 36a. The second exhaust pipe 37 has an opening 37a at the bottom wall 30a of the auxiliary vacuum chamber 30, unlike the first exhaust pipe 36. The second exhaust pipe 37 is connected to the first exhaust pipe 36 outside the auxiliary vacuum chamber 30. A turbo pump 38 and a rotary pump 39 and the like are successively arranged on the downstream side of a connection point between the first exhaust pipe 36 and second exhaust pipe 37. A bypass pipe 40 is branched from the first exhaust pipe 36, and the bypass pipe 40 is connected once again to the first exhaust pipe 36 between the turbo pump 38 and the rotary pump 39. Valves 41 and 42 are arranged on the first exhaust pipe 36 and second exhaust pipe 37 respectively, at the upstream side of the connection point therebetween and valves 43 and 44 are arranged on the first exhaust pipe 36 and the bypass pipe 40, respectivley, at the downstream side of a branch point therebetween.

The exhaust port 36a of the first exhaust pipe 36 may be situated at any point apart from the wall of the chamber 30, and the distance between the port 36a and the wall may be freely chosen. However, the farther from the wall, the better the effect. Practically, if about 5 mm is kept between the port 36a and the wall, a desired effect can be attained. It is desirable that the exhaust port 36a be situated at such a position that the semiconductor wafer W is hardly influenced by particles even if the particles are concentrated at the exhaust port when the gas in the auxiliary vacuum chamber 30 is evacuated. For example, it is desirable that the exhaust port 36a be situated slightly below the semiconductor wafer W.

The diameter of the first exhaust pipe 36 projecting into the auxiliary vacuum chamber 30 is not limited. However, if the diameter of the pipe 36 is too large, particles may easily be dispersed. Thus, the diameter of the pipe 36 should be around 1 to 20 mm, and desirably, 5 to 10 mm. For example, the diameter of the exhaust pipe 36 can be set at 6 mm or 9 mm.

In the apparatus having the above structure, the auxiliary vacuum chamber 30 is at first set at an atmospheric pressure, and the gate valve 22 is opened. The multi-joint arm 32 of the transfer robot 31 receives the semiconductor wafer W from the auto-loader 50. Thereafter, the valve 22 is closed, and the auxiliary vacuum chamber 30 is evacuated via the gas exhaust pipe 36 to a pressure level close to the degree of vacuum in the vacuum processing chamber 10.

Subsequently, the gate valve 21 is opened, and the vacuum processing chamber 10 and auxiliary vacuum chamber 30, which are both maintained at a vacuum pressure level, are made to communicate with each other. Then, the semiconductor wafer W is transferred onto the lower electrode 11 in the vacuum processing chamber 10 by means of the transfer robot 31, and the gate valve 21 is closed.

In the vacuum processing chamber 10, the clamp mechanism 12 is actuated to hold the semiconductor wafer W on the lower electrode 11. In this state, the etching gas is supplied into the vacuum processing chamber 10 from the gas supply source 15 via the gas supply pipe 14 and pores 13b of the upper electrode 13. High-frequency voltages are applied to the lower and upper electrodes 11 and 13, thereby activating the etching gas into a plasma. At this time, the lower electrode 11 is heated at high temperatures, but such a trouble as melting of the electrode does not occur by virtue of the helium gas flowing within the circulation path 11a to cool the lower electrode 11.

In the etching process, the vacuum processing chamber 10 is evacuated by the exhaust apparatus 19 via the vacuum exhaust pipe 18 to a constant degree of vacuum of $10^{-6}$ Torr in the state in which the etching gas is not introduced.

After the etching, the gate valve 21 is opened and the semiconductor wafer W is transferred by the multi-joint arm of the transfer robot 31 into the auxiliary vacuum chamber 30 which is maintained at a predetermined degree of vacuum. Then, the gate valve 21 is closed.

Subsequently, nitrogen gas is introduced as purge gas into the auxiliary vacuum chamber 30 from the gas supply source 34 via the gas supply pipe 33, thereby restoring the auxiliary vacuum chamber 30 from the vacuum state to the normal pressure state. Then, the gate valve 22 is opened and the semiconductor wafer W is taken out.

In the series of the above steps, the evacuation of the auxiliary vacuum chamber 30 will now be described in detail. After the multi-joint arm 32 of the transfer robot 31 receives the semiconductor wafer W from the autoloader 50 and the wafer W is put in the auxiliary vacuum chamber 30, the gate valve 22 is closed and the auxiliary vacuum chamber 30 is sealed off.

Then, the valves 41 and 44 are partially opened and the rotary pump 39 is activated to effect slow evacuation. At this time, the other valves 42 and 43 are closed. By the slow evacuation, the gas in the auxiliary vacuum chamber 30 is gradually evacuated from the exhaust port 36a of the first exhaust pipe 36. In this case, since the exhaust port 36a of the first exhaust pipe 36 is situated apart from the bottom wall of the auxiliary vacuum chamber 30 on which particles have fallen, the gas can be evacuated substantially without causing a gas flow on the bottom wall.

Figure 3:
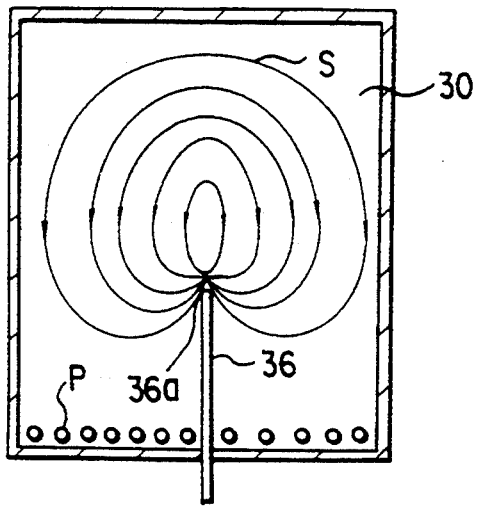
FIG. 3 shows schematically an exhaust flow in the case of the present invention.

Specifically, the gas near the exhaust port is exhausted from the exhaust port, and, as schematically shown in FIG. 3, an exhaust action becomes effective around the exhaust port by virtue of the viscosity of the gas and a viscous gas flow occurs. The gas in the auxiliary vacuum chamber 30 is slowly evacuated from a portion at the center of the chamber 30, and the particles on the bottom wall are not substantially influenced by the viscous flow. Thus, the particles are not dispersed.

When the pressure in the auxiliary vacuum chamber 30 has reached to the degree of vacuum of, e.g. about $10^{-3}$ Torr by the slow evacuation, the valves 41 and 44 are closed and the other valves 42 and 43 are opened. Thus, the main evacuation is effected by means of the turbo pump 38 and rotary pump 39 via the second exhaust pipe 37. The moment the pressure within the auxiliary vacuum chamber 30 has reached a pressure level close to the degree of vacuum of the vacuum processing chamber 10 (e.g. $10^{-4}$ to $10^{-5}$ Torr), the gate valve 21 is opened.

The operations of the valves are controlled by a suitable control apparatus (not shown) on the basis of a detection value of a pressure sensor (not shown) provided within the auxiliary vacuum chamber.

At the time of main evacuation, the degree of vacuum of the auxiliary vacuum chamber 30 is high, and a molecular flow having a long average molecular free path becomes predominant in the gas of the chamber 30. Since collision energy of gas molecules against particles P on the bottom wall can be ignored, submicron-order or half-micron-order particles P, if any, are not dispersed by the molecular flow.

As has been described above, according to the above-described embodiment, at the time of the initial evacuation in which the viscous flow S is predominant, the gas is evacuated from the exhaust port 36a of the first exhaust pipe 36, which is projected to the inside of the auxiliary vacuum chamber 30 and is situated apart from the bottom wall, until the inside of the chamber 30 has reached a predetermined degree of vacuum. At the time of the main evacuation in which the molecular flow is predominant, the gas is evacuated from the exhaust port 37a of the second exhaust pipe 37, which is formed at the bottom wall of the chamber 30. Thus, even very fine submicron-order or half-micron-order particles P of, e.g. 1 to 0.03 $\mu$m are hardly dispersed at the time of gas evacuation. Accordingly, such particles P do not adhere to the semiconductor wafer W in the auxiliary vacuum chamber 30. Thus, semiconductor wafers W for 16MDRAM or devices with more capacity, which require submicron-order or half-micron-order very fine processing, can be subjected to vacuum process with high quality and without degrading the yield. Furthermore, in this embodiment, only one first exhaust pipe 36 projecting into the auxiliary vacuum chamber 30 may be added to a conventional apparatus, and therefore an effective countermeasure to particle dispersion can be achieved at low cost.

Figure 4:
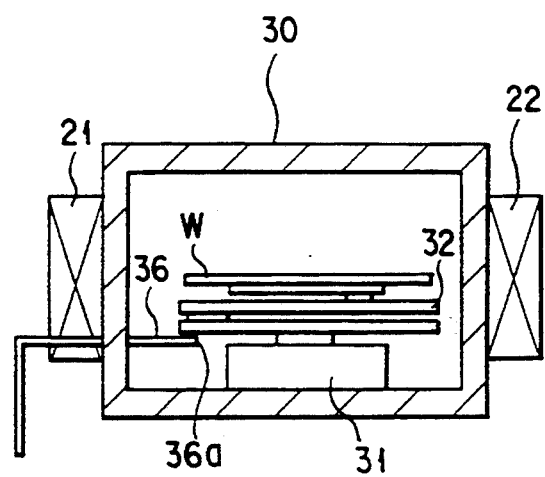
FIG. 4 shows a modification of an auxiliary vacuum chamber in the apparatus shown in FIG. 2.

In the above vacuum processing apparatus, the first exhaust pipe projects from the bottom wall into the internal space, but the exhaust pipe may be constructed, as shown in FIG. 4. In an auxiliary chamber shown in FIG. 4, the first exhaust pipe 36 projects from a side wall portion of the auxiliary chamber 30 into the internal space, and the pipe 36 has an exhaust port 36a at its tip end. The other structural features of the chamber 30 are the same as those of the chamber 30 shown in FIG. 2. In this example, too, the exhaust port is situated apart from the wall of the auxiliary chamber, and therefore the same advantage as in the apparatus shown in FIG. 2 can be obtained.

In the above aspect of the invention, the exhaust port is formed at the tip end portion of the first exhaust pipe projecting into the auxiliary treatment chamber, but the shape of the exhaust port may be freely designed according to necessity. For example, as shown in FIG. 5A, a filter 36b such as a ceramic filter may be provided at the tip end of the exhaust pipe 36. As shown in FIG. 5B, an exhaust port 36c having many small pores 36d may be employed. Furthermore, as shown in FIG. 5C, the tip portion of the exhaust pipe 36 may be branched into plural portions so that gas may be exhausted from distal exhaust ports 36a. By employing these structures, more effective slow evacuation can be performed. Furthermore, the same advantage can be obtained by using a plurality of exhaust pipes having their exhaust ports situated apart from the wall.

Besides, as shown in FIG. 6, it is possible to make the upper part of the exhaust pipe 36 movable, and to shift the exhaust port 36 to a desired position by means of a moving mechanism 60 comprising a ball screw 61, a motor 62 for rotating the ball screw 61 and a guide member 63 for guiding the exhaust pipe 36. Thereby, evacuation is performed at a desired portion, and the exhaust port 36a may be situated at a position where the possibility of dispersion of particles is lowest. Moreover, as shown in FIG. 7, the exhaust pipe 36 may be provided with a trapezoidal tip portion so as to prevent particles from adhering to the tip portion of the exhaust pipe 36, thereby preventing dispersion of particles more exactly.

Figure 8:
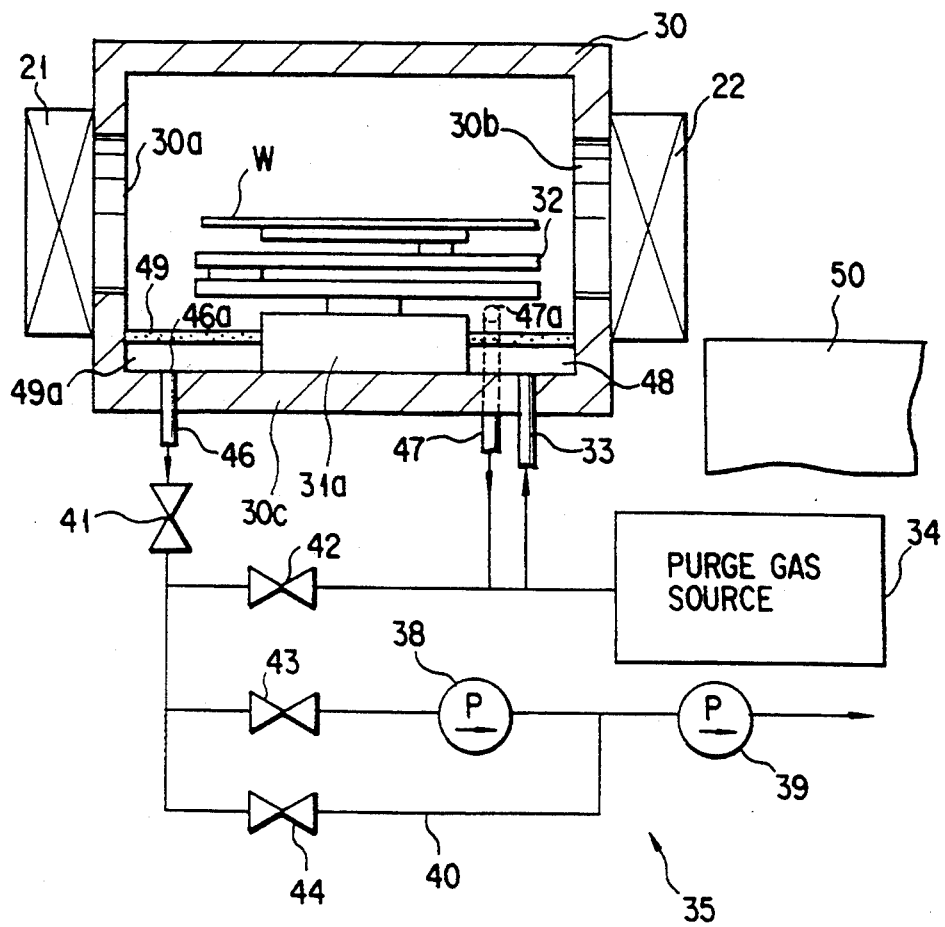
FIG. 8 is a cross-sectional view showing an auxiliary vacuum chamber used in a vacuum processing apparatus according to another aspect of the invention.
Figure 9:
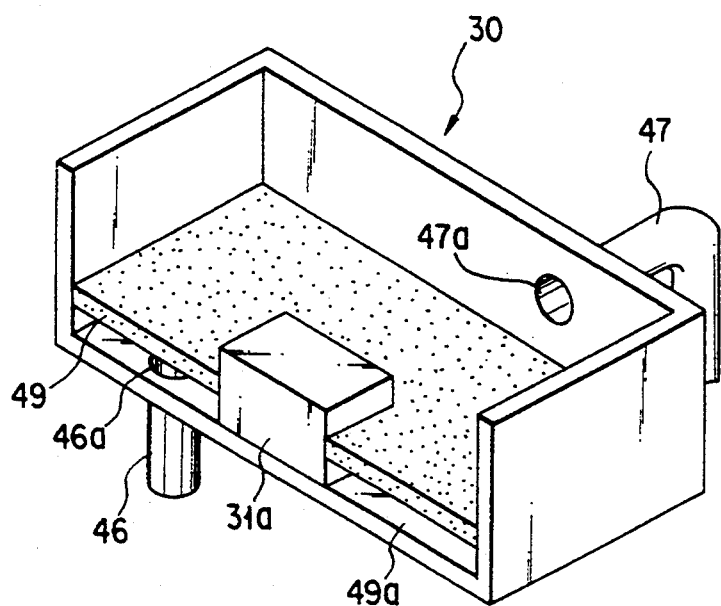
FIG. 9 is a perspective view showing the inside of the auxiliary vacuum chamber shown in FIG. 8.

A vacuum processing apparatus according to another embodiment of the invention will now be described. FIG. 8 is a cross-sectional view showing an auxiliary vacuum chamber of this vacuum processing apparatus, and FIG. 9 is a perspective view showing the inside of the auxiliary vacuum chamber. This auxiliary vacuum chamber 30 has the same structure as that shown in FIG. 2, except for exhaust system 35. The exhaust system 35 comprises a first exhaust pipe 46 having a distal exhaust port 46a at the bottom wall of the auxiliary vacuum chamber 30, and a second exhaust pipe 47 having an exhaust port 47a at the side wall of the auxiliary vacuum chamber 30. The structures of pipes for connecting these first and second exhaust pipes, the bypass pipe, and the pumps and valves connected to these pipes are the same as the structures shown in FIG. 2. These common structural elements are denoted by like reference numerals, and a description thereof is omitted.

In this embodiment, the exhaust system 35 includes an exhaust member 49 made of a plate-like porous member at a bottom region of the auxiliary vacuum chamber 30. The exhaust member 49 is situated at a distance from the bottom wall 30c of the auxiliary vacuum chamber 30 so as to cover the entire bottom surface except the base table 31a of the transfer robot 31. A gas-passage chamber 49a is formed between the exhaust member 49 and the bottom wall 30c. The exhaust member 49 is put in air-tight contact with the side wall of the auxiliary vacuum chamber 30 and the base table 31a of the transfer robot. Accordingly, the entire gas exhausted from the first exhaust pipe 46 passes through the exhaust member 49. The second exhaust pipe 47 is situated above the exhaust member 49 at the side wall of the auxiliary vacuum chamber 30. When the gas is exhausted from the second exhaust pipe 47, it is not passed through the exhausted member 49.

The porous material of the exhaust member 49 is, for example, a sintered material or glass wool, and the thickness thereof is set optionally so as to obtain an optimal conductance for gas passage.

In this embodiment, like the embodiment as shown in FIG. 2, the auxiliary vacuum chamber 30 is set at an atmospheric pressure, and the gate valve 22 is opened. The semiconductor wafer W is received from the autoloader 50. Thereafter, the valve 22 is closed, and the auxiliary vacuum chamber 30 is evacuated to a pressure level close to the degree of vacuum in the vacuum processing chamber 10. Subsequently, the gate valve 21 is opened, and the vacuum processing chamber 10 and auxiliary vacuum chamber 30, which are both maintained at a vacuum pressure level, are made to communicate with each other. Then, the semiconductor wafer W is transferred onto the lower electrode 11 in the vacuum processing chamber 10, and the gate valve 21 is closed. The etching treatment is effected within the vacuum processing chamber 10.

After the etching, the gate valve 21 is opened and the semiconductor wafer W is transferred into the auxiliary vacuum chamber 30 which is maintained at a predetermined degree of vacuum. Then, the gate valve 21 is closed.

Subsequently, nitrogen gas is introduced as purge gas into the auxiliary vacuum chamber 30 from the gas supply source 34 via the gas supply pipe 33, thereby restoring the auxiliary vacuum chamber 30 from the vacuum state to the normal pressure state. Then, the gate valve 22 is opened and the semiconductor wafer W is taken out.

In the evacuation of the auxiliary vacuum chamber 30, like the above-described first embodiment, the valves 41 and 44 are at first opened and the slow evacuation is performed by driving the rotary pump 39. Thereby, the pressure within the gas-passage chamber 49a decreases suddenly, and accordingly the pressure within the auxiliary vacuum chamber 30 decreases. When the pressure within the chamber 30 has fallen to, e.g. 10 mTorr to 100 Torr, the valve 41 is closed and the valve 42 is opened and gas exhaust is effected through the second exhaust pipe 47. Furthermore, when the pressure within the chamber 30 has reached, e.g. $10^{-3}$ Torr, the valve 44 is closed and the valve 43 is opened. Thus, the main evacuation is effected by means of the turbo pump 38 and rotary pump 39. The moment the pressure within the auxiliary vacuum chamber 30 has reached a pressure level close to the degree of vacuum of the vacuum processing chamber 10 (e.g. $10^{-4}$ to $10^{-5}$ Torr), the gate valve is opened. In this aspect of the invention, too, the operations of the valves are controlled by a suitable control apparatus (not shown) on the basis of a detection value of a pressure sensor (not shown) provided within the auxiliary vacuum chamber.

Figure 10:
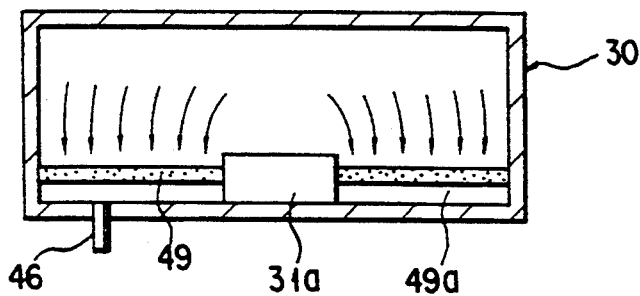
FIG. 10 shows a gas flow within the auxiliary vacuum chamber in FIG. 8.

By this gas exhaust, the pressure within the exhaust pipe 46 decreases suddenly at the beginning of the evacuation of the auxiliary vacuum chamber 30. However, since the gas-passage chamber 49a communicating with the exhaust pipe 46 is partitioned from the atmosphere of the wafer transfer region within the auxiliary vacuum chamber 30 by means of the exhaust member 49 situated to face the bottom wall of the chamber 30, a gas stream is produced within the wafer transfer region of the auxiliary vacuum chamber 30, as shown in FIG. 10, such that the gas stream is directed from the upper region of the exhaust member 49 towards the entire surface of the exhaust member 49. Since a horizontal gas flow along the surface of the exhaust member 49 is small, dispersion of particles can be prevented. In addition, since the exhaust member 49 is situated above the bottom wall 30c of the auxiliary vacuum chamber 30, particles on the bottom wall 30c is not dispersed.

When evacuation is performed via the exhaust member 49, the exhaust rate decreases in accordance with the conductance of the porous material constituting the exhaust member 49. In this embodiment, only at the initial stage of evacuation, gas exhaust is carried out via the exhaust member 49. After the pressure reaches a predetermined level, gas is exhausted at high rate via the second exhaust pipe 47 not via the exhaust member 49. Thus, an increase in time for evacuation is avoided, and the through-put does not deteriorate. The inventors understand that in the conventional apparatus, dispersion of particles occurs when the internal pressure decreases suddenly at the beginning of evacuation and such dispersion of particles does not substantially occur after the evacuation is carried out to a certain degree of vacuum. It is clear that adhesion of particles on the wafer W can effectively be prevented in this embodiment.

It is not necessary that the exhaust member 49 covers the entire bottom surface of the auxiliary vacuum chamber 30, but it is desirable that the area of the exhaust member 49 be greater than at least the area of the exhaust port of the conventional exhaust pipe. The area of the exhaust member 49 is suitably designed in accordance with the shape of the auxiliary vacuum chamber 30, the degree of fine processing for devices to be manufactured on the wafer, etc.

In the above embodiment, the gas-passage chamber 49a is formed between the exhaust member 49 and the bottom wall 30c of the auxiliary chamber 30. However, it is possible to bring the exhaust member 49 into direct contact with the bottom wall 30c and connect exhaust pipes directly to the lower surface of the exhaust member 49 at a plurality of locations.

Figure 11:
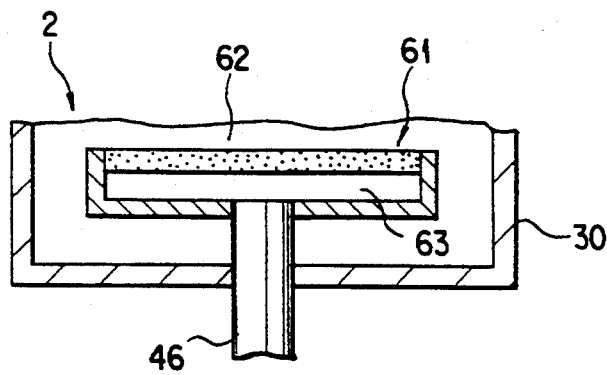
FIG. 11 shows a modification of an exhaust system in the apparatus in FIG. 8.

Alternatively, as shown in FIG. 11, a unit 61 comprising an exhaust member 62 and a gas-passage chamber 63 may be connected to the exhaust port of the exhaust pipe 46 apart from the bottom wall 30c of the auxiliary vacuum chamber 30.

Furthermore, since the exhaust member 46 needs only to have many fine holes, the aforementioned porous member may be replaced by a metallic plate with many fine holes.

In this embodiment, the first exhaust pipe is formed at the bottom wall 30c, but, needless to say, it may be formed at the side wall.

Figure 12:
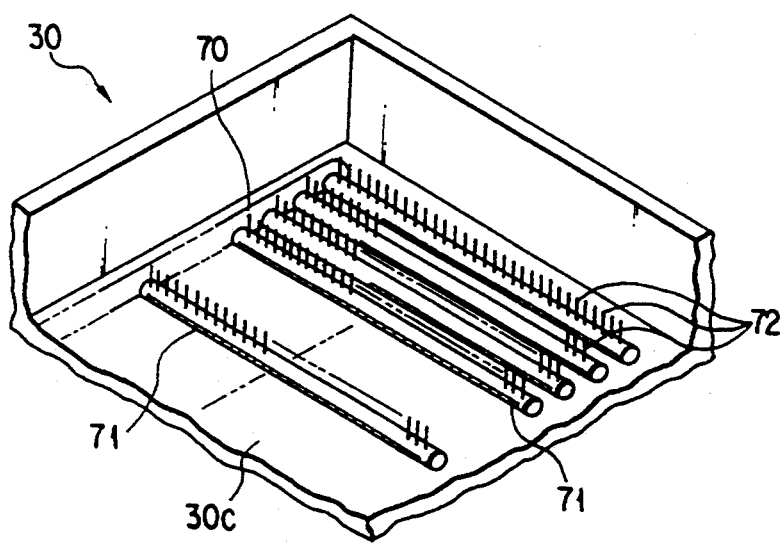
FIG. 12 is a perspective view showing the inside of an auxiliary vacuum chamber used in a vacuum processing apparatus according to still another aspect of the invention.

Still another embodiment of the present invention will now be described. FIG. 12 is a perspective view showing the inside of an auxiliary vacuum chamber used in a vacuum processing apparatus according to this embodiment. In this embodiment, a suction-side portion of an exhaust pipe 70 of the auxiliary vacuum chamber 30 is branched in a comb-shape, and branched pipes 71 are provided along a bottom wall 30c of the chamber 30. Many needle-like exhaust thin pipes 72 are vertically erected on each branched pipe 71. Gas is exhausted from exhaust ports formed at the distal ends of the thin pipes 72. In this structure, many fine exhaust ports are provided on many branched pipes. Thus, the viscous flow S, as in the prior art, can be prevented. Furthermore, since the distal exhaust ports of the exhaust thin pipes 72 are located away from the bottom wall 30c, it is possible to effectively prevent particles on the bottom wall from being dispersed by the viscous flow S produced at the time of evacuation.

In each embodiment of the invention as described above, the auxiliary vacuum chamber 30 is employed as a pressure variable chamber which is maintained at a vacuum pressure when an object to be processed is put in the vacuum processing chamber. In the present invention, the pressure variable chamber is not limited to the auxiliary vacuum chamber, but to any other type of chamber whose internal pressure can be varied in accordance with the input/output of the object to be processed when the object is subjected to predetermined vacuum processing.

For example, the present invention is applicable to a multi-chamber type treatment apparatus as shown in FIG. 13. This apparatus comprises two vacuum processing chambers 100 and 102 for dry etching, a vacuum processing chamber 104 for CVD treatment, a transfer chamber 108 for transferring a semiconductor wafer W into these vacuum processing chambers and taking out the wafer W from these vacuum processing chambers, a load-lock chamber 106, and auto-loaders 110 and 112, on which wafer cassettes are mounted, for putting in and taking out wafers.

The load-lock chamber 106 can communicate with the auto-loaders 110 and 112 via gate valves 114 and 116. The transfer chamber 108 can communicate with the vacuum processing chambers 100, 102 and 104 via gate valves 118, 120 and 122. The load-lock chamber 106 can communicate with the transfer chamber 108 via a gate valve 107. Transfer arms 124 and 126, which are rotatable and extensible for transferring semiconductor wafers, are provided, respectively, within the load-lock chamber 106 and transfer chamber 108. The semiconductor wafers W are transferred by means of these arms 124 and 126.

These chambers 100, 102, 104, 106 and 108 have independent exhaust systems. Of these, the chambers 106 and 108 are provided with exhaust systems having exhaust ports apart from the wall surfaces, like the above-described auxiliary vacuum chamber 30.

In this apparatus, when the wafer W is transferred, the vacuum processing chambers 100, 102 and 104 are maintained at a predetermined degree of vacuum and, in this state, the pressure within the chambers 106 and 108 is varied repeatedly between the atmospheric pressure and the degree of vacuum of the vacuum chamber. Specifically, the load-lock chamber 106 and the transfer chamber 108 are employed as pressure variable chambers of the present invention with this structure, too, the pressure variable chambers may be provided with any one of the above-described exhaust systems. Needless to say, the above-described advantages can be obtained in the case of this apparatus.

The vacuum processing apparatus of the present invention is applicable, not only to etching apparatuses, but also to vacuum CVD apparatuses, ashing apparatuses, ion-injection apparatuses, sputtering apparatuses, etc.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A vacuum processing apparatus comprising:
   a vacuum processing chamber for subjecting an object to be processed to a vacuum process;
   a pressure variable chamber whose internal pressure is variable repeatedly between an atmospheric pressure and a process pressure, when the object is put in and taken out of said vacuum processing chamber; and
   exhaust means for exhausting gas from said pressure variable chamber;
   wherein said exhaust means has at least one exhaust port comprising a porous body which is positioned within said pressure variable chamber and located apart from an internal wall surface of said pressure variable chamber.

2. The apparatus according to claim 1, wherein when the object is transferred between an atmospheric region and said vacuum processing chamber, said pressure variable chamber is maintained at an atmospheric pressure in the case where the object is transferred into the pressure variable chamber from the atmospheric region, and said pressure variable chamber is maintained at a vacuum pressure in the case where the object is transferred from the pressure variable chamber into the vacuum processing chamber.

3. The apparatus according to claim 1, wherein said pressure variable chamber includes an object-transferring mechanism, and said exhaust port is situated below said object on said object-transferring mechanism.

4. A vacuum processing apparatus comprising:
   a vacuum processing chamber for subjecting an object to be processed to a vacuum process;
   a pressure variable chamber whose internal pressure is variable repeatedly between an atmospheric pressure and a process pressure, when the object is put in and taken out of said vacuum processing chamber;

means for supporting the object within said pressure variable chamber; and exhaust means for exhausting gas from said pressure variable chamber;

wherein said exhaust means has at least one exhaust port located apart from an internal wall surface of said pressure variable chamber and vertically below the object supported within said pressure variable chamber, said exhaust port having a plurality of small holes for permitting a slow exhaustion of gas from said pressure variable camber.

5. The apparatus according to claim 4, wherein when the object is transferred between an atmospheric region and said vacuum processing chamber, said pressure variable chamber is maintained at an atmospheric pressure in the case where the object is transferred into the pressure variable chamber from the atmospheric region, and said pressure variable chamber is maintained at a vacuum pressure in the case where the object is transferred from the pressure variable chamber into the vacuum processing chamber.

6. A vacuum processing apparatus comprising:

a vacuum processing chamber for subjecting an object to be processed to a vacuum processing;

a pressure variable chamber having means for receiving the object to be processed, said pressure variable chamber having an internal pressure which is variable repeatedly between an atmospheric pressure and a process pressure when the object is put in and taken out of said vacuum processing chamber; and exhaust means for exhausting gas from said pressure variable chamber, wherein said exhaust means includes an exhaust port formed in a wall of the pressure variable chamber and an exhaust member positioned within said pressure variable chamber and situated to face said wall, said exhaust member having many fine pores, and a gas within said pressure variable chamber is exhausted from said exhaust port via said many fine pores of the exhaust member.

7. The apparatus according to claim 6, wherein said exhaust member is formed of a porous material.

8. The apparatus according to claim 7, wherein said exhaust member covers substantially the entire bottom wall of said pressure variable chamber.

9. The apparatus according to claim 6, wherein a gas-passage chamber is formed between said exhaust member and a bottom wall of said pressure variable chamber.

10. The apparatus according to claim 9, wherein said exhaust member and said gas-passage chamber are formed as a unit.

11. A vacuum processing apparatus comprising:

a vacuum processing chamber for subjecting an object to be processed to a predetermined vacuum process;

a pressure variable chamber whose internal pressure is variable repeatedly between an atmospheric pressure and a process pressure, when the object is put in and taken out of said vacuum processing chamber; and exhaust means for exhausting gas from said pressure variable chamber;

wherein said exhaust means has at least one exhaust port located apart from an internal wall surface of said pressure variable chamber, said exhaust means includes an exhaust pipe projecting into said pressure variable chamber, a distal end portion of said exhaust pipe is provided with an exhaust port, and an end portion of said exhaust pipe defines a thickness which gradually decreases in a direction toward a tip portion of said exhaust pipe.

12. The apparatus according to claim 11, wherein when the object is transferred between an atmospheric region and said vacuum processing chamber, said pressure variable chamber is maintained at an atmospheric pressure in the case where the object is transferred into the pressure variable chamber from the atmospheric region, and said pressure variable chamber is maintained at a vacuum pressure in the case where the object is transferred from the pressure variable chamber into the vacuum processing chamber.

13. The apparatus according to claim 11, wherein said pressure variable chamber includes an object-transferring mechanism, and said exhaust port is situated below said object on said object-transferring mechanism.

* * * * *